United States Patent [19]

Hayashi et al.

[11] Patent Number: 5,650,959
[45] Date of Patent: Jul. 22, 1997

[54] MEMORY DEVICE HAVING VIRTUAL GROUND LINE

[75] Inventors: Tetsuya Hayashi, Tokyo; Akira Takata; Kazuhiro Watanabe, both of Osaka, all of Japan

[73] Assignee: NKK Corporation, Tokyo, Japan

[21] Appl. No.: 540,473

[22] Filed: Oct. 10, 1995

[30] Foreign Application Priority Data

Oct. 25, 1994 [JP] Japan .................. 6-284303

[51] Int. Cl.$^6$ .................................. G11C 11/34
[52] U.S. Cl. .............................. 365/182; 365/203
[58] Field of Search ................... 365/182, 205, 365/104, 230.06, 203, 185.16, 185.18

[56] References Cited

U.S. PATENT DOCUMENTS

| | | | |
|---|---|---|---|
| 4,805,143 | 2/1989 | Matsumoto et al. | 365/104 |
| 4,847,808 | 7/1989 | Kobatake | 365/104 |
| 4,868,790 | 9/1989 | Wilmoth | 365/104 |
| 5,020,026 | 5/1991 | Schreck | 365/104 |
| 5,022,008 | 6/1991 | Schreck | 365/201 |
| 5,132,933 | 7/1992 | Schreck | 365/104 |
| 5,163,021 | 11/1992 | Mehrotra | 365/201 |
| 5,202,848 | 4/1993 | Nakagawara | 365/104 |

FOREIGN PATENT DOCUMENTS

| | | |
|---|---|---|
| 2-235295 | 2/1990 | Japan . |
| 2-285593 | 2/1990 | Japan . |
| 5-167042 | 5/1993 | Japan . |
| 5-198775 | 5/1993 | Japan . |

Primary Examiner—A. Zarabian
Attorney, Agent, or Firm—Nixon & Vanderhye

[57] ABSTRACT

This memory device includes a plurality of word lines, a plurality of bit lines, a plurality of virtual ground lines, memory cells arranged at the intersections between the word and bit lines, a potential setting unit for setting the potential of the virtual ground lines to a ground or bias level, and a sense amplifier for detecting storage information of a target memory cell through the bit line when the virtual ground line connected to the target memory cell is set to the ground level by the potential setting unit. To read out information from a memory cell Mij, a virtual ground line GLi connected to the electrode of this memory cell is set to the ground level, and the remaining virtual ground lines are connected to a common bias potential line set to the bias level.

83 Claims, 5 Drawing Sheets

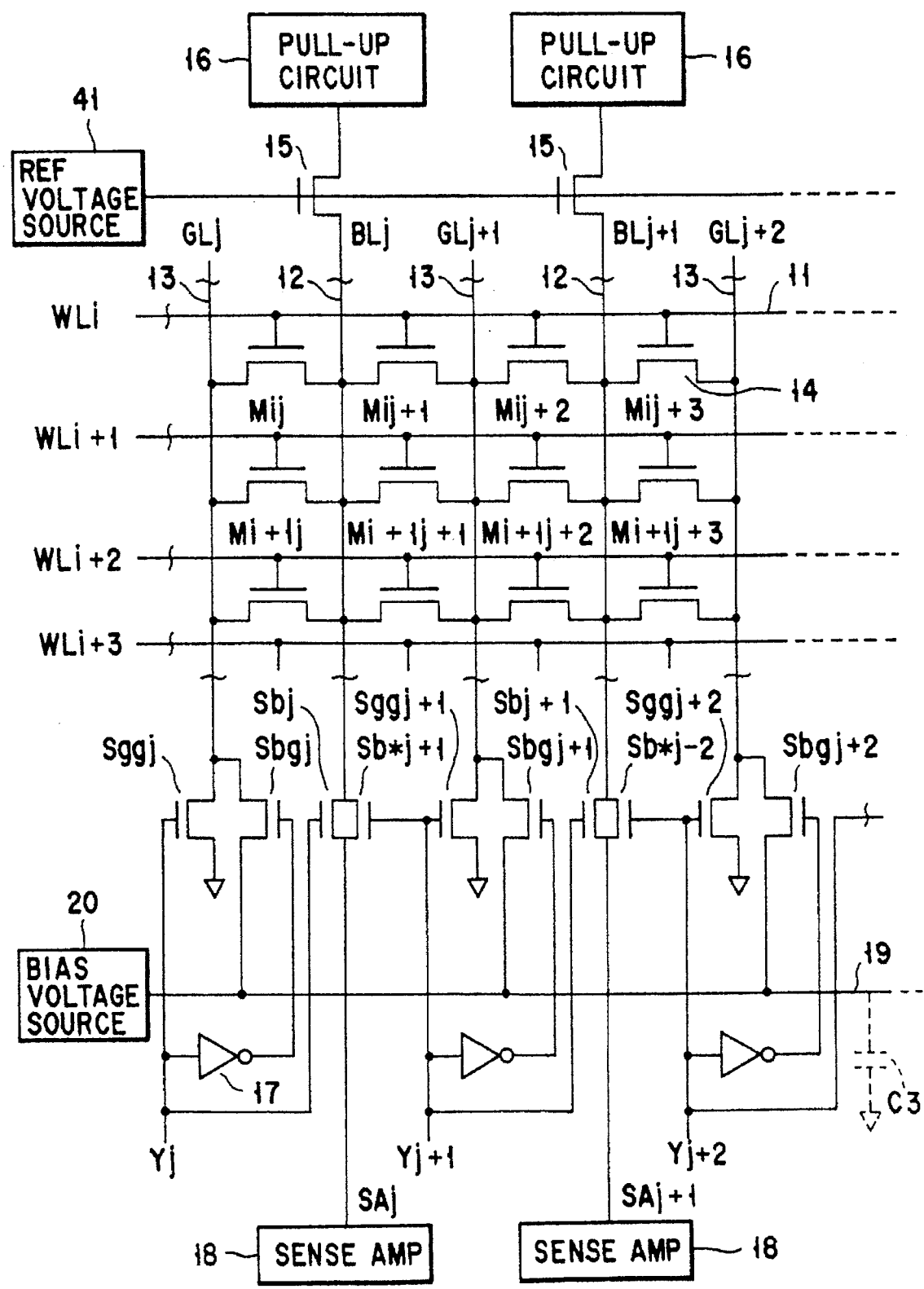
F I G. 1

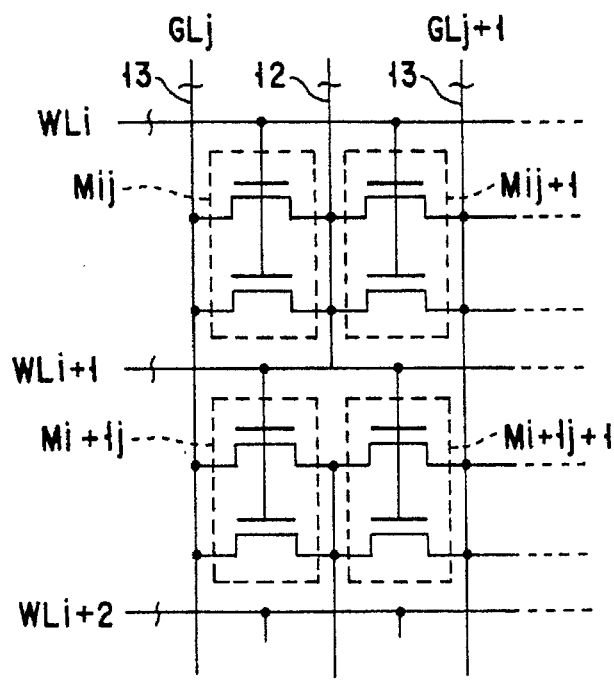
F I G. 2
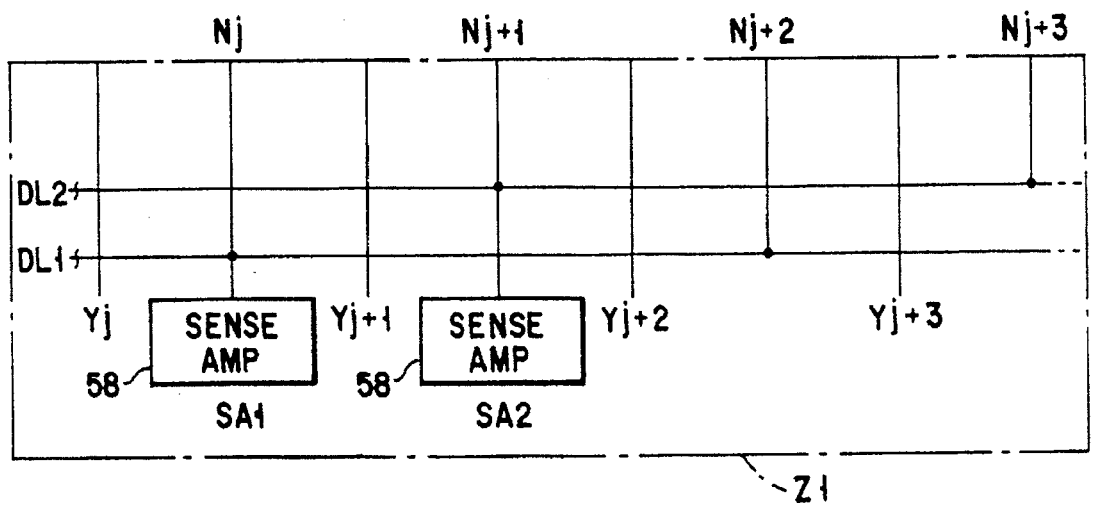
F I G. 4

| READ CELL | Mij+1 | Mij+2 | Mij+3 | Mij+4 | Mi+1j+1 | Mi+1j+2 |
|---|---|---|---|---|---|---|
| SENSE AMP | SAj | SAj+1 | SAj+1 | SAj+2 | SAj | SAj+1 |
| WLi | H | | H | | L | |
| WLi+1 | L | | L | | H | |
| WLi+2 | L | | L | | L | |
| WLi+3 | L | | L | | L | |
| Yj | L | | L | | L | |
| Yj+1 | H | | L | | H | |
| Yj+2 | L | | H | | L | |

FIG. 6

| READ CELL | MAij | Maij+1 | MBij | Mbij+1 | MAij+1 | Maij+2 |
|---|---|---|---|---|---|---|
| SENSE AMP | SAj / SA1 | SAj+1 / SA2 | SAj / SA1 | SAj+1 / SA2 | SAj+1 / SA2 | SAj+2 / SA1 |
| BS | H | | H | | H | |
| SR | L | | L | | H | |
| SL | H | | H | | L | |
| WLi | H | | H | | H | |
| WLi+1~n | L | | L | | L | |
| Yj | L | | L | | L | |
| Yj+1 | H | | H | | L | |
| Yj+2 | L | | L | | H | |
| YL | H | | H | | L | |
| YR | L | | L | | H | |

FIG. 7

MEMORY DEVICE HAVING VIRTUAL GROUND LINE

BACKGROUND OF THE INVENTION

1. Field of the Invention

The present invention relates to an improvement in a semiconductor memory device and, more particularly, to a nonvolatile memory device in which potential variations of internal signal lines which are caused in reading out storage information from a memory cell are suppressed.

2. Description of the Related Art

A background art nonvolatile memory device proposed prior to the present invention has an internal circuit arrangement shown in, e.g., FIG. 5. Only memory cells required for descriptive convenience are illustrated in consideration of continuity of a large number of memory cells.

Referring to FIG. 5, reference numerals 21 denote word lines WLi, WLi+1, . . . ; 22, bit lines BLj, BLj+1, . . . ; and 24, memory cells Mij, Mij+1, Mi+1j . . . A memory cell incorporating at least one MOS transistor having source, drain, and gate electrodes is arranged at the intersection between each word line 21 and each bit line 22.

Memory cells 24 are arranged in a matrix form. The gate electrodes of the respective memory cells are connected to word lines 21 in units of rows. The drain and source electrodes of these memory cells are connected to bit lines 22 and virtual ground lines 23 represented by GLj, GLj+1, . . . in units of columns. Each bit line 22 is connected to corresponding pull-up circuit (constant voltage circuit) 26 through corresponding bias load MOS transistor 25 and set at a high potential level. These bit lines 22 are connected to sense amplifiers 28 represented by SAj, SAj+1, . . . through switching MOS transistors 27a controlled by selection signals Yj, Yj+1, . . . , respectively.

Each bias load MOS transistor 25 is set in a normally ON state because it is connected to reference voltage source 31. Each virtual ground line 23 is set in a bias or ground level through corresponding switching element (MOS transistor) 27b ON/OFF-controlled by selection signal Yj. Control signal S and control signal S* as the inverted signal of control signal S determine the potential level at which each virtual ground line 23 is set.

When potential line 29 connected to virtual ground line GLj is set at the ground level (or bias level) upon ON/OFF operations of switching elements S1 and S2 and switching elements S*1 and S*2 controlled by control signals S and S*, potential line 30 connected through switching element 27b to virtual ground line GLj+1 adjacent to virtual ground line GLj is set at the bias level (or ground level).

Data read access to programmed memory cells is performed by causing a sense amplifier to detect an ON state of the MOS transistor of each memory cell between the corresponding bit and virtual ground lines.

For example, assume that word line WLi is selected so as to turn on the gate of selection target memory cell Mij in memory cells arranged in the matrix form. Signal Yj is applied to turn on switching MOS transistors 27a and 27b respectively coupled to bit line (BLj) 22 and virtual ground line (GLj) 23 connected to the source and drain of memory cell Mij. When MOS transistor 27a is turned on, bit line BLj is connected to corresponding sense amplifier 28. When MOS transistor 27b is turned on, virtual ground line GLj is connected to potential line 29.

When the source-drain path of memory cell Mij is set in the ON state under the condition that the connection end potential between memory cell Mij and virtual ground line GLj is set at the ground level, the potential of bit line BLj changes to flow a current to this bit line. Sense amplifier 28 connected to bit line BLj can detect the ON state of memory cell Mij. At this time, if the source-drain path of memory cell Mij is set in an OFF state, the potential of bit line BLj does not change, and no current flows. Therefore, sense amplifier 28 can detect the OFF state of memory cell Mij. Upon detection of the ON/OFF state, information stored in memory cell Mij can be read out.

At this time, memory cell Mij+1 adjacent to memory cell Mij is arranged on the same word line as in memory cell Mij, memory cells Mij and Mij+1 are simultaneously selected. However, since virtual ground line GLj+1 is connected to common bias potential line 30 through switching element Sg2 and is set at the bias level, no potential difference occurs in the source-drain path of memory cell Mij+1. No current flows in this source-drain path regardless of the programmed state of cell Mij+1. Therefore, data read access to memory cell Mij will not be avoided.

In reading information from memory cell Mij+1 adjacent to memory cell Mij, control signals S and S* are switched to set virtual ground line GLj+1 to the ground level, and the same operations as described above are performed.

Data can be read out from memory cells Mij and Mij+1 in accordance with selection of word line WLi and switching operations of control signals S and S*. These operations are repeated to arbitrarily and continuously read out the program information stored in the memory cells.

The above description has exemplified a binary memory in which information stored in memory cells is binary data. The principle of operation is basically kept unchanged even in multi-value memories.

The nonvolatile memory device having the arrangement shown in FIG. 5 has the following problems.

(1) In reading out storage information from memory cell Mij, equivalent parallel capacitances C1 and C2 are generated in common potential lines 29 and 30 in accordance with the substrate-wiring parasitic capacitance of one virtual ground line GLj, the diffusion capacitances of switching elements Sg1, Sg2, S1, S2, S*1, and S*2, and the parasitic capacitances of common potential lines 29 and 30 themselves. In reading out memory information upon switching common potential lines 29 and 30 from the bias level to the ground level, and vice versa, it takes time to charge or discharge common potential lines 29 and 30 (equivalent capacitances C1 and C2). For this reason, bias charging to virtual ground line 23 (GLj . . . ) is delayed, and hence high-speed data read access to the memory device is impaired. In addition, equivalent capacitances C1 and C2 are charged/discharged every time information is read out. The power consumption of the memory device is increased by a current component caused by this charge/discharge operation.

(2) Sense amplifier 28 is generally of a current detection type and normally includes a feedback circuit system. In this case, bias voltage source 20* is arranged by a feedback circuit system similar to that of sense amplifier 28. When such a feedback circuit system is included, overshooting or ringing may occur in the potential change of the common potential line due to the presence of equivalent capacitances C1 and C2 and the wiring inductance of the signal lines during abrupt charging of virtual ground line 23 to the bias level by bias voltage source 20*. When this overshooting or ringing has occurred, the potential of the common potential line is not converged to a desired bias level, but varies to interfere with the operational stability of the nonvolatile memory device. It also takes a long period of time to stabilize the bias level (or to eliminate overshooting or ringing). As a result, high-speed data read access is impaired.

In particular, problems associated with the parasitic capacitances (C1 and C2) and the electrical characteristics of the feedback circuit system also vary depending on the manufacturing process of nonvolatile memory devices. Therefore, these problems are significant in view of product yields, manufacturing costs, and quality.

(3) Bias voltage source 20* in FIG. 5 requires to rapidly charge common potential line 29 or 30. For this reason, the internal circuit scale (i.e., a circuit area in an IC chip) is large and complicated, resulting in an increase in power consumption.

SUMMARY OF THE INVENTION

The present invention has been made in consideration of the above situation, and has as its object to provide a memory device which can be stably operated at high speed.

It is another object of the present invention to provide a memory device which can reduce power consumption in addition to the stable, high-speed operation.

It is still another object of the present invention to provide a memory device which can reduce the dependence on the manufacturing process in addition to the stable, high-speed operation and the reduction in power consumption.

In order to achieve the above objects, there is provided a memory device comprising a plurality of word lines, a plurality of bit lines, a plurality of virtual ground lines respectively having parasitic capacitances, memory cells arranged at intersections between the word lines and the bit lines, each memory cell having a first electrode connected to a corresponding one of the word lines and second and third electrodes respectively connected to corresponding ones of the bit lines and the virtual ground lines, a common bias potential line selectively connected to the virtual ground lines, bias means for charging the common bias potential line to a predetermined bias level, potential setting means capable of setting a potential of the virtual ground line to the bias level charged by the bias means or a predetermined ground level, and a sense amplifier for sensing recorded information of a target read access memory cell through the corresponding bit line when the virtual ground line connected to the target read access memory cell is set at the ground level by the potential setting means, wherein remaining virtual ground lines other than the virtual ground line set at the ground level are connected to the common bias potential line by the potential setting means.

In the memory device of the present invention, the predetermined virtual ground line is set to the ground or bias level by the potential setting means. In this case, the remaining virtual ground lines are connected to the common bias potential line. A total equivalent capacitance of the common bias potential line is set much larger than the parasitic capacitance of each virtual ground line in accordance with the sum of the parasitic capacitances of the remaining virtual ground lines.

The "charge/discharge phenomenon" of the common bias potential line during potential switching of the predetermined virtual ground line can be suppressed by the large total equivalent capacitance of the common bias potential line. That is, variations in bias level of the common bias potential line during charging of the predetermined potential ground line can be suppressed to be very small. As a result, the bias level of the common bias potential line can be stabilized to allow stable, proper read access to the memory cell.

The common bias potential line need not be charged/discharged during the potential switching from the bias level to the ground level of the predetermined virtual ground line. For this reason, the common bias potential line need not be charged at high speed by the bias voltage source. Therefore, the circuit arrangement of the bias voltage source can be relatively simplified, and the power consumption of the memory device can be reduced as a whole.

The total equivalent capacitance including the sum of the parasitic capacitances of the remaining virtual ground lines connected to the common bias potential line can be set large enough to neglect the wiring parasitic capacitance depending on the manufacturing process of the memory device and the variations in diffusion capacitances of the internal transistors. For this reason, the dependence of the read performance and power consumption of the memory device on the manufacturing process can be reduced. That is, even if the manufacturing process conditions slightly vary, the read performance and power consumption of the memory products will not vary.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a circuit diagram showing the main part of a nonvolatile memory device according to an embodiment of the present invention;

FIG. 2 is a circuit diagram showing another arrangement of memory cells included in the memory device shown in FIG. 1;

FIG. 4 is a circuit diagram showing a modification of a sense amplifier in the memory device shown in FIG. 3;

FIG. 6 is a table for explaining the operation of the memory device shown in FIG. 1; and FIG. 7 is a table for explaining the operation of the memory device shown in FIG. 3.

DETAILED DESCRIPTION OF THE PREFERRED EMBODIMENTS

A nonvolatile memory device according to an embodiment of the present invention will be described with reference to the accompanying drawings. A NOR mask ROM will be exemplified below.

FIG. 1 shows the main part of the nonvolatile memory device according to an embodiment of the present invention.

Figure 5:
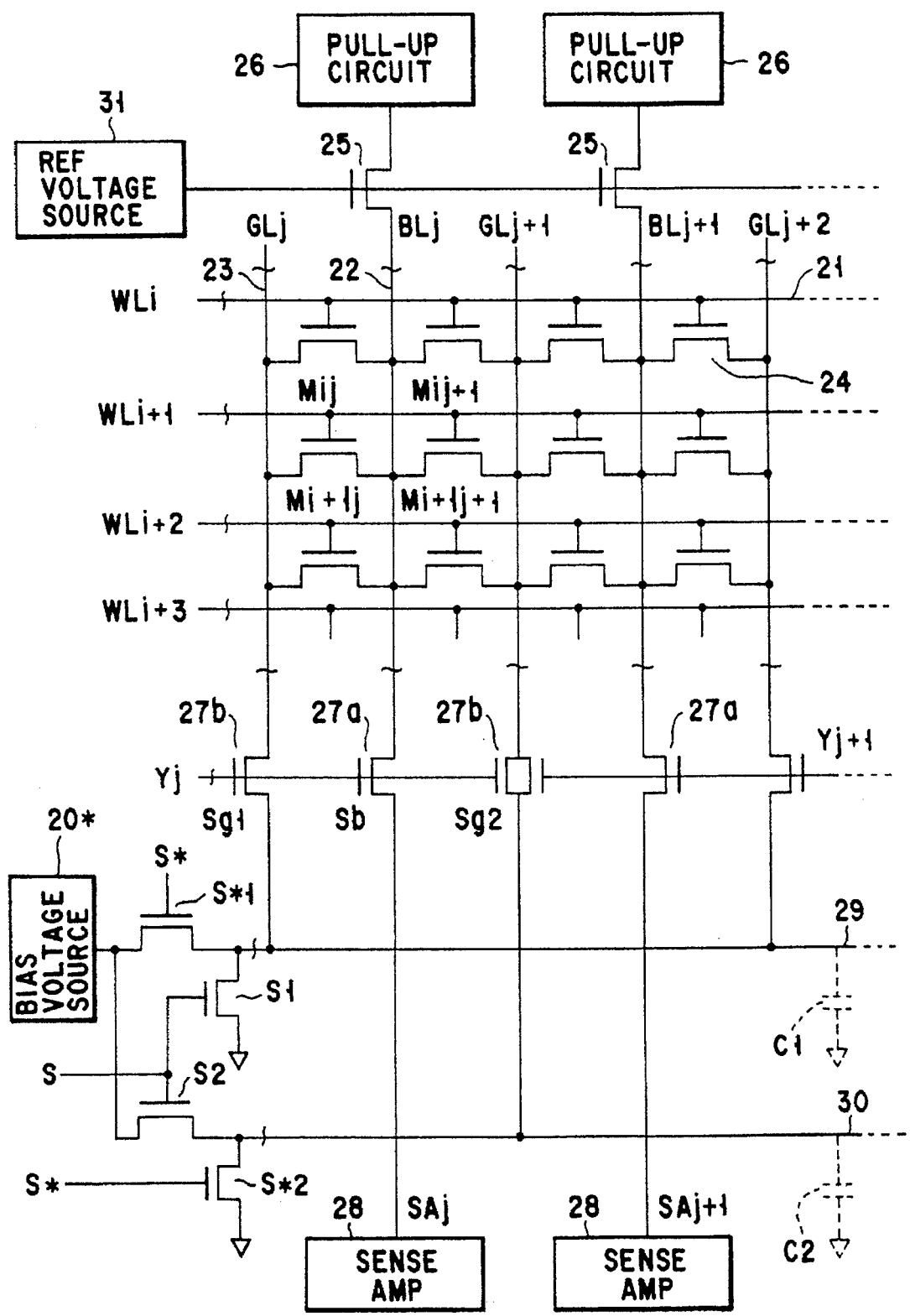
FIG. 5 is a circuit diagram showing the main part of a background art nonvolatile memory device.

Referring to FIG. 1, memory cells arranged in a matrix form are some of a large number of memory cells, as in FIG. 5. Reference numeral 11 denotes word lines WLi, WLi+1 ... ; and 12, bit lines BLj, BLj+1, .... Memory cell 14 incorporating at least one MOS transistor having source, drain, and gate electrodes is arranged at the intersection of each word line 11 and each bit line 12.

Memory cells 14 in FIG. 1 are constituted by a large number of MOS transistors Mij, Mij+1, Mi+1j, Mi+j+1, ... arranged in the matrix form. The gates of the MOS transistors are connected to word lines 11 in units of rows, and two remaining electrodes (source and drain) are connected to bit lines 12 represented by BLj, BLj+1, ... and virtual ground lines 13 represented by GLj, GLj+1, ... in units of columns.

Each bit line 12 is connected to corresponding pull-up circuit 16 including a constant voltage circuit through corresponding bias load MOS transistor 15. Bias load MOS transistor 15 is normally ON because it is connected to reference voltage source 41.

Each bit line 12 is set at a high potential level by corresponding pull-up circuit 16 and connected to a corresponding one of current detection sense amplifiers 18 represented by SAj, SAj+1 through a corresponding one of switching elements (MOS transistors) Sbj, Sbj+1, ... which are turned on/off in accordance with selection signals Yj, Yj+1, .... The input and output terminals of inverter 17 are connected to the gates of switching elements Sggj and Sbgj, respectively. The gates of switching elements Sggj and Sbj are commonly connected. The sources of switching elements Sggj and Sggj+1 are connected to ground circuits (represented by triangular marks), respectively.

One terminal of each of virtual ground lines 13 is connected to a corresponding one of the drain electrodes (or source electrodes) of switching elements (MOS transistors) Sggj, Sbgj, Sggj+1, and Sbgj+1 which are turned on/off in accordance with selection signals Yj, Yj+1, and Yj+2 ...

The source electrodes (or drain electrodes) of switching elements Sggj, Sggj+1, ... are connected to the ground circuits of the memory device, and the source electrodes (or drain electrodes) of the switching elements Sbgj, Sbgj+1, ... are commonly connected to common bias potential line 19. Common bias potential line 19 is charged to a predetermined bias level by bias voltage source 20. This bias level (i.e., the potential of bit line 12 connected to sense circuit 18) is normally set equal to the sense level.

In this circuit arrangement, when switching elements (MOS transistors) Sggj, Sbgj, Sggj+1, Sbgj+1, ... are turned on/off in accordance with the signal levels of selection signals Yj, Yj+1, Yj+2, ...., virtual ground lines 13 are alternatively set to one of the bias level of common bias potential line 19 and the ground level of the ground circuits.

The other terminal of each virtual ground line 13 is kept open or be left alone, so that the source (or drain) potential of the MOS transistor (e.g., Mji) in memory cell 14 connected to this virtual ground line 13 can be lowered to the ground level within a short period of time.

The operation of the embodiment shown in FIG. 1 will be described below. Virtual ground lines 13 are set to the bias or ground level through switching elements Sggj, Sbgj, Sggj+1, and Sbgj+1 which are turned on/off in accordance with the H or L levels of selection signals Yj and Yj+1. Switching element Sggj is operated in accordance with the level of selection signal Yj. A selection signal as the inverted signal of the signal level of selection signal Yj is input to switching element Sbgj through inverter 17, so that switching element Sbgj performs an ON/OFF operation opposite to that of switching element Sggj. This also applies to the relationship between the ON/OFF operations of switching elements Sggj+1 and Sbgj+1 and the levels of selection signal Yj+1. As a result, virtual ground lines 13 are alternatively set to the ground or bias level through switching elements Sggj, Sggj+1, ... or switching elements Sbgj, Sbj+1, ....

To read out data from programmed memory cells, word line WLi is selected so as to turn on the gate of arbitrary memory cell Mij as a selection target, and switching elements Sbj and Sggj of bit line BLj and virtual ground line GLj which are connected to the two electrodes, i.e., the source and drain electrodes of this memory cell are turned on in accordance with selection signal Yj.

In this case, assuming that memory cell Mij stores information rendered conductive between the source and the drain, when the potential of the connection end between memory cell Mij and virtual ground line 13 is switched to the ground level, sense amplifier SAj detects the ON state (e.g., a state in which information is stored) of the memory cell Mij. To the contrary, if memory cell Mij is set in the OFF state between the source and drain, and even if the potential of the connection end between memory cell Mij and virtual ground line 13 is switched to the ground level, the potential of bit line BLj does not change (i.e., a bit line current does not flow). Therefore, the sense amplifier SAj+1 detects the OFF state (e.g., a state in which information is erased) of memory cell Mij.

To perform read access to memory cell Mij+1 adjacent to memory cell Mij, switching elements Sb*j+1 and Sggj+1 are turned on in accordance with H level of selection signal Yj+1. Assuming that memory cell Mij+1 is set in the ON state between the source and drain, when the potential of the connection end between memory cell Mij+1 and virtual ground line 13 is switched to the ground level, sense amplifier 18 (SAj) detects the ON state (information-written state) of memory cell Mij+1. Assuming that memory cell Mij+1 is set in the OFF state between the source and drain, when the potential of the connection end between memory cell Mij+1 and virtual ground line 13 is switched to the ground level, sense amplifier 18 (SAj) detects the OFF state (information-erased state) of memory cell Mij+1.

To perform read access to memory cells Mi+1j and Mi+1j+1, the same operations as described above are performed except that word line WLi+1 is selected.

Read access to other memory cells can be performed in the same manner as described above. The relationship between several target read memory cells and the corresponding word line (e.g., WLi) signal levels and selection signal line (e.g., Yj) levels is shown in the truth table in FIG. 6 (although sense circuit SAj+2 and memory cell Mij+4 in this truth table are not illustrated in FIG. 1, they are located to the right of sense amplifier SAj+1 and memory cell Mij+3 in FIG. 1).

In the nonvolatile memory device shown in FIG. 1, if the target read cell is memory cell Mij, virtual ground line GLj connected to the electrode of this cell is set to the ground level, and all or most of the remaining virtual ground lines (GLj+1, GLj+2, ... ) are connected to common bias potential line 19 charged to the bias level. For this reason, total equivalent capacitance C3 as the sum of the parasitic capacitances of the remaining virtual ground lines connected to common bias potential line 19, the diffusion capacitances of a large number of switching element transistors (e.g., Sggj and Sbgj), and the parasitic capacitance of common bias potential line 19 itself is much larger than equivalent capacitance C1 or C2 in the background art nonvolatile memory device shown in FIG. 5.

The example in FIG. 5 is compared with the embodiment shown in FIG. 1 under the conditions that their memory capacities (on the order of kilobytes or megabytes or more) and matrix arrangements are equal to each other.

The number of common bias potential lines (29 in FIG. 5; 19 in FIG. 1) in information read access to one memory cell is one in FIG. 5. However, in FIG. 1, all the remaining virtual ground lines 13 which are not set at the ground level are connected to common bias potential line 19. That is, the number of virtual ground lines connected to the common bias potential line is much larger in FIG. 1 than that in FIG. 5. For this reason, the value of total equivalent capacitance C3 in FIG. 1 is much larger than the value of equivalent capacitance C1 or C2 in FIG. 5.

The nonvolatile memory device in FIG. 1 has large total equivalent capacitance C3 parallel to common bias potential line 19 and the remaining or numbers of virtual ground lines which are not set at the ground level and which are connected thereto. For this reason, in charging virtual ground line 13 connected to the read cell, the bias level of common bias potential line 18 rarely varies. Even if this bias level varies, its amount is very small. Therefore, the data read operation of the memory cell can be stably performed.

Common bias potential line 19 is charged once upon power-ON of the memory device and then kept at the stable bias level by large total equivalent capacitance C3. For this reason, in switching the virtual ground line potential from the bias level to the ground level, no charge/discharge phenomenon occurs in the common bias potential line. The problem of the memory device (FIG. 5) in which the read access to the memory cell is delayed due to the charge/discharge operation of the total equivalent capacitance of the common bias potential line is not posed in the memory device of FIG. 1. The power consumption of the memory cell can be reduced as a whole because there is no current caused by the charge/discharge operation of the common bias current line.

The bias generator in bias voltage source 20 need not charge common bias potential line 19 at high speed and can have a relatively simple, compact arrangement. This also contributes to the reduction in power consumption of the memory device.

The dependence of the performance of the memory device on the manufacturing process is low because the value of total equivalent capacitance C3 is large enough to neglect the variations in the internal wiring parasitic capacitance and the internal transistor diffusion capacitance which depend on the manufacturing process. Therefore, a nonvolatile memory device almost free from quality variations can be obtained with a high yield.

When a current detection amplifier including a feedback circuit is used as sense amplifier 18, slight overshooting may occur in common bias potential line 19 in potential switching of the virtual ground line connected to the read cell. However, this overshooting can be stabilized within a very short period of time, and no trouble occurs in a high-speed read operation.

Each of memory cells 14 arranged in the matrix form in FIG. 1 may be constituted by two parallel-connected MOS transistors, as shown in FIG. 2. Four memory cells are formed at positions surrounded by virtual ground lines GLj and GLj+1 and word lines WLi and WLi+1 in FIG. 2.

A memory device according to another embodiment of the present invention will be described with reference to FIG. 3. This nonvolatile memory cell is also a NOR mask ROM.

Figure 3:
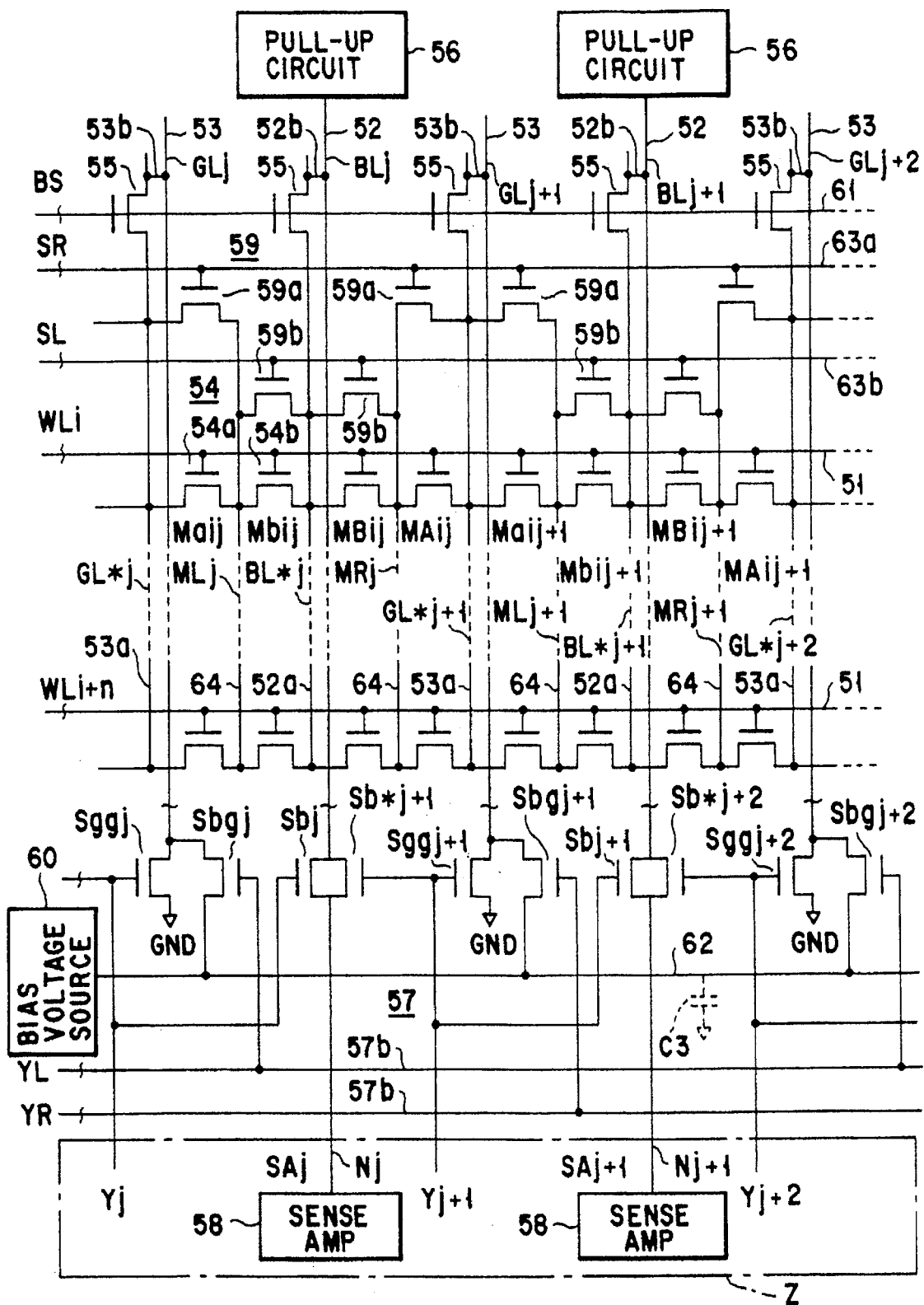
FIG. 3 is a circuit diagram showing the main part of a nonvolatile memory device according to another embodiment of the present invention.

Referring to FIG. 3, one memory cell 54 comprises MOS transistors 54a and 54b, and memory cells 54 constitute an array structure of memory cells arranged in a matrix form. Some memory cells of one row are illustrated as (Maij, Mbij), (Maij+1, Mbij+1), . . . (MBij, MAij), (MBij+1, MAij+1), . . . in FIG. 3.

Transistor pairs (Maij, Mbij), (MBij, MAij), (Maij+1, Mbij+1), (MBij+1, MAij+1), . . . in memory cells 54 are symmetrically arranged at intersections between word lines (WLi, . . . WLi+n) 51 and bit lines (BLj, BLj+1) 52.

The array structure of memory cells 54 is divided into a plurality of subarrays. Each subarray is enabled or disabled through corresponding block selection MOS transistor 55 which is turned on/off in accordance with block selection signal BS.

The gate electrodes of MOS transistors 54a and 54b in each memory cell 54 are connected to a corresponding one of word lines (WLi, . . . WLi+n). The commonly connected electrodes (e.g., source electrodes) of these MOS transistors are connected to intermediate lines (MLj, MLj+1, . . . MRj, MRj+1) 64, respectively. The remaining electrodes (e.g., drain electrodes) of MOS transistors 54a are connected to secondary virtual ground lines (GL*j, GL*j+1 . . . ) 53a, respectively. The remaining electrodes (e.g., drain electrodes) of MOS transistors 54b are connected to secondary bit lines (BL*j, BL*j+1) 52a, respectively.

Secondary virtual ground lines (GL*j, GL*j+1, . . . ) 53a are connected to virtual ground lines (GLj, GLj+1. . . ) 53 through block selection MOS transistors 55 and connection portions 53b, respectively. Secondary bit lines (BL*j, BL*j+1 . . . ) 52a are connected to bit lines (BLj, BLj+1. . . ) 52 through block selection MOS transistors 55 and connection portions 52b and, through bit lines 52, to pull-up circuits 56 including constant voltage circuits, respectively. Bit lines 52 are pulled up to the sense level by pull-up circuits 56 and kept at this potential.

The upper terminals (FIG. 3) of virtual ground lines 53 and the lower terminals (FIG. 3) of secondary virtual ground lines 53a may be connected to an appropriate voltage source. These terminals are kept open or left alone in this embodiment so as to drop the source potentials of the MOS transistors of the memory cells to the ground level within a short time.

Intermediate lines (MLj, MLj+1 . . . ) 64 are respectively connected to secondary virtual ground lines 53a and secondary bit line 52a through cell selection elements 59 each consisting of MOS transistors 59a and 59b. The switching electrodes (gate electrodes) of MOS transistors 59a and 59b are connected to cell selection lines 63a and 63b, respectively.

Each bit line (BLj, BLj+1 . . . ) 52 is pulled up to the sense level by corresponding pull-up circuit 56. Pulled-up bit line (BLj, BLj+1 . . . ) 52 is finally connected to a corresponding one of current detection sense amplifiers (SAj, SAj+1 . . . ) 58 through a corresponding one of switching elements (Sbj, Sbj+1 . . . , Sb*j, Sb*j+1 . . . ) ON/OFF-controlled by selection signal (Yj, Yj+1 . . . ).

Virtual ground lines (GLj, GLj+1 . . . ) 53 are set to the bias level of common bias potential line 62, the ground level of ground line GND, or the open state (i.e. the state which belongs to neither the bias level nor the ground level) in accordance with ON/OFF operations of switching elements (Sggj, Sggj+1, . . . Sbgj, Sbgj+1 . . . ) ON/OFF-controlled by selection signals (Yj, Yj+1 . . . ) and (YL, YR).

When virtual ground line 53 upon selection of a given word line is kept in the open state, e.g., when virtual ground line GLj upon selection of word line WLi is kept in the open state, information cannot be read out from the four pairs of right left memory cells (Maij, Mbij, MAij, MBij, Maij-1, Mbij-1, MAij-1, MBij-1) centered on virtual ground line GLj.

To set virtual ground line 53 to the bias level, any one of switching elements Sbgj to Sbgn is turned on to connect virtual ground line 53 to common bias potential line 62. This common bias potential line 62 is charged to the potential set by bias voltage source 60 and kept at this potential.

The operation of the embodiment shown in FIG. 3 will be described below. Virtual ground lines 53 are set to the bias or ground level through switching elements (Sggj, Sbgj, Sggj+1, Sbgj+1, Sggj+2) ON/OFF-controlled by the H or L levels of selection signals (Yj, YL, YR). Switching element Sbj is operated together with switching element Sggj in accordance with selection signal Yj. Unlike in the embodiment of FIG. 1, no inverters are arranged for these switching elements.

Secondary ground lines 53a are selectively set to a potential corresponding to the bias or ground level as a result of circuit operation. Each secondary bit line 52a is electrically connected to corresponding sense amplifier 58 while being kept at the potential defined by corresponding pull-up circuit 56.

Selection signal YR is applied to the gate electrodes Sbgj+1 . . . through selection signal lines 57a, while selection signal YL is applied to the gate electrodes of switching elements Sbgj, Sbgj+2, . . . through selection signal lines 57b.

Read access to programmed memory cells in FIG. 3 will be described below.

First, information read access to memory cell Maij will be described. When cell selection signal SR of L level is applied to corresponding cell selection element 59a through corresponding cell selection line 63a, this element 59a is turned off. At the same time, cell selection signal SL of H level is applied through corresponding cell selection line 63b, element 59b of this memory cell Maij is turned on. Block selection signal BS of H level is applied to corresponding block selection MOS transistor 55 through corresponding block potential line 61, this transistor 55 is turned on.

When this transistor 55 is turned on, corresponding secondary bit line 52a is connected to corresponding bit line 52, and intermediate line MLj is disconnected from corresponding secondary ground line 53a upon turn-OFF operation of element 59a connected to corresponding bit line 52. By the turn-ON operation of this element 59b, intermediate line MLj is connected to corresponding secondary bit line 52a. As a result, intermediate line MLj is charged with the potential of secondary bit line 52a (BL*j) almost equal to that of bit line 52 (BLj).

When word line WLi is selected, and a signal of H level is applied to the gate of memory cell Maij, this memory cell Maij becomes a target read cell.

When selection signal Yj of H level is applied to the gate electrode of switching element Sggj, this element Sggj is turned on to switch the level of virtual ground line GLj to the ground level. At this time, since the potential of intermediate line MLj is set almost equal to that of secondary bit line BL*j, a potential difference occurs between the source and drain electrodes of memory cell Maij.

The potential difference between the source and drain electrodes of memory cell Maij changes in accordance with storage information of memory cell Maij. More specifically, when memory cell Maij stores information such that the MOS transistors therein are turned on upon reception of a signal of H level from word line WLi, memory cell Maij is turned on to reduce the potential difference between the source and drain electrodes thereof. The potentials of secondary bit line BL*j and bit line BLj connected thereto are reduced accordingly.

When selection signal Yj of H level is applied to the gate electrode of switching element Sggj to turn on switching element Sggj, selection signal Yj of H level is also applied to the gate electrode of switching element Sbj, so that switching element Sbj is turned on. Therefore, sense amplifier (SAj) 58 detects a decrease in potential of bit line BLj to read out the ON information stored in memory cell Maij.

At this time, no substantial potential difference occurs between the source and drain electrodes of the other memory cell Mbij (the source-drain path is short-circuited upon turn-ON of element 59b). Information will not be read out from memory cell Mbij.

To the contrary, to read out information from memory cell Mbij, cell selection signal SL of L level is applied to corresponding cell selection element 59b through corresponding cell selection line 63b to turn on corresponding element 59b. At the same time, cell selection signal SR of H level is applied to corresponding cell selection element 59a through corresponding cell selection line 63a, and the same operation as in read access to memory cell Maij are performed. Intermediate line MLj goes to the ground level through this element 59a, and read access to memory cell Mbij can be enabled.

When selection signal Yj of H level is applied to the gate electrode of switching element Sbj to turn on element Sbj, switching element Sbj+1 is not turned on in accordance with at least selection signal Yj+1. Otherwise, information of memory cell MBij or MAij would be simultaneously read out by the same sense amplifier SAj, thereby causing an operation error. If selection signal Yj+1 is set at H level (or L level), selection signals Yj and Yj+2 are set at L level (or H level) accordingly.

When selection signal Yj is set at H level and at the same time selection signal YL is set at H level to set virtual ground line GLj to the ground level, common bias potential line 62 is grounded to disable read access. Therefore, when selection signal Yj is set at H level, selection signal YL is always set at L level.

When selection signal Yj is set at H level to cause sense amplifier SAj to read out information from memory cell Maij or Mbij, virtual ground line GLj+1 must be properly set to the bias level so as not to detect information of memory cell MBij or MAij. In this case, selection signal YR goes to H level to turn on switching element Sbgj+1.

As described above, to read out memory cell information using a given selection signal (Yj, Yj+1 . . . ), selection signals YR and YL are set at opposite potential levels.

On the other hand, to read out information from memory cell Mai+1j or Mbi+1j (not shown) of the second column the first row, the same method as described can be used to read out information except that word line WLi+1 is selected. The same read operation as described with reference to memory cell Maij or Mbij can be performed for read access to memory cell MBij or BAij except that selection signal Yj+1 is selected, as a matter of course.

Read access to other memory cells can be performed in the same manner as described above. The relationship between several target read cells and the corresponding word line (WLi to WLi+n) signal levels and selection signal line (e.g., Yj) levels is shown in the truth table in FIG. 7 (although memory cell Maij+2 in the truth table is not illustrated in FIG. 3, it is located to the right of memory cell MAij+1 in FIG. 3).

In the above operation, the virtual ground line associated with the target read cell is set at the ground level. However, all the remaining virtual ground lines are connected to common bias potential line 62 and are not necessarily set to the bias level defined by bias voltage source 60. Both switching elements (Sggj, Sggj+1, ... ) and (Sbgj, Sbgj+1, ... ) may be kept off, and the remaining virtual ground lines may be kept in the open state.

For this reason, equivalent capacitance C3 formed in common bias potential line 62 in FIG. 3 is set larger than equivalent capacitance C1 or C2 of the background art memory device shown in FIG. 5, but is smaller than that of the embodiment in FIG. 1. However, in the embodiment of FIG. 3, the number of virtual ground lines connected to common bias potential lines 62 in the embodiment of FIG. 3 is much larger than that in FIG. 5, and total equivalent capacitance C3 in FIG. 3 is much larger than that in FIG. 5.

More specifically, as in the embodiment of FIG. 1, large total equivalent capacitance C3 is formed in common bias potential line 62 connected to a plurality of virtual ground lines in the embodiment of FIG. 3. For this reason, variations in bias level of common bias potential line 62 are always vary small, if any. A stable read access to a memory cell can be realized. In addition, memory device products having a low dependence of performance of the memory device on the manufacturing process and almost free from quality variations can be obtained.

In addition, since charging/discharging of common bias potential line 62 during read access is unnecessary, no operational delay is caused by charging/discharging equivalent capacitance C3, and high-speed read access can be achieved. Power consumption of the memory device can also be reduced. When a sense amplifier is of a current detection type, common bias potential line 62 is charged only upon power-ON of the memory device in FIG. 3. This power-ON charging will not interfere with high-speed read access.

Memory cells arranged in the matrix form in the nonvolatile memory device shown in FIG. 3 are not limited to the embodiment having memory cells each having one memory cell, but a plurality of memory cells may be used as in FIG. 2. In addition, a memory need not be a binary memory, but can obviously be a multi-value memory to equally practice the present invention. Each memory cell of the multi-value memory can store information representing any of two or more data pieces.

If the equivalent capacitance of the common bias potential line connected to the virtual ground lines is large enough to achieve the function and effect intended by the present invention, virtual ground lines belonging to a plurality of blocks may be respectively connected to a plurality of common bias potential lines without departing the scope of the technical concept of the present invention.

A memory device of the present invention is not limited to the mask ROMs exemplified in the above embodiments. The present invention is also applicable to a programmable nonvolatile memory device including an EPROM.

If the total number of virtual ground lines is n times the number of virtual ground lines which are simultaneously set to the ground level, bias potential Vbias is reduced by Vbias×(1/n) because the virtual ground lines at the ground level are charged to bias potential Vbias (in this case, the parasitic capacitance of the common bias potential line is neglected). If potential variation $\Delta VBL$ (=VBLh−VBL1 where VBLh is the maximum value of the potential variation of this bit line and VBL1 is the minimum value thereof) is set to 100 mV, it is empirically apparent that sensing (information read access) in the sense amplifier be proper within variation width $\Delta Vbias$ of bias potential Vbias of 100 mV. Therefore, if Vbias=1.5 V, then it can be concluded that good sensing is performed for $1.5 \times (1/n) \leq 0.1$, i.e., $m \geq 15$.

According to an aspect of the memory device of the present invention, a sufficiently large number of virtual ground lines can be set to the bias potential by a potential setting means (17 in FIG. 1; Sgg·Sbg) in data read access. Judging from the above description, a "sufficiently large number" means the number n satisfying condition Vbias× $(1/n) \leq \Delta VBL$.

In each embodiment of the present invention, a current detection sense amplifier is preferably used to allow a high-speed operation. However, a voltage detection sense amplifier can also be used.

In the embodiment shown in FIG. 1 or 3, one terminal of each virtual ground line, which is opposite to the other terminal located on the side of the ground potential source, is kept open or left alone (i.e., a state in which any bias source such as pull-up circuit is not connected to the virtual ground potential line) so as to increase the data read operation of the corresponding memory cell. However, the virtual ground potential line need not be kept go open. For example, this open terminal may be connected to an appropriate capacitor (capacitive component). When a capacitive component is added to the open terminal of the virtual ground line, a time required for charging the virtual ground line to the bias potential is prolonged by a time corresponding to the added capacitive component, possibly resulting in an operational disadvantage in a sense. However, a change in potential of the common bias potential line connected to a large number of virtual ground lines can be reduced. Further, it is exceptionally possible that such 'open' terminal includes the terminal of the virtual ground line that can be electrostatically connected to the other circuit element physically remoted therefrom.

In each of the embodiments shown in FIGS. 1 and 3, each bit line BLj is directly connected to one sense amplifier. However, the number of sense amplifiers can be reduced relative to the number of bit lines. More specifically, one sense amplifier may be prepared for a plurality of bit lines, and signals from these bit lines may be input to one sense amplifier through a multiplexer, thereby sensing the multiplexed information in the sense amplifier. With this arrangement, for example, a circuit arrangement of region Z surrounded by the broken line in FIG. 3 can be replaced with a circuit arrangement of region Z1 in FIG. 4, thereby reducing the number of sense amplifiers to two (SA1, SA2).

FIG. 4 shows a modification of the sense circuit in the memory device shown in FIG. 3. Nodes Nk (k=1, 2, ... , j, J+1, ... ) in FIG. 4 correspond to those in FIG. 3. Node Nk is connected to bit line BLk through switching element Sbk or Sb*k+1 in read access. Nodes Np (p=1, 3, 5, ... , Nj, Nj+2, Nj+4, ... ) are connected to common data line DL1, while node Np+1 is connected to common data line DL2. Each data line is connected to a corresponding one of common sense amplifiers 58 (SA1, SA2). For this reason, for example, when selection signal Yj+1 is selected, the signal from node Nj is detected by sense amplifier SA1, while the signal from node Nj+1 is detected by sense amplifier SA2. When selection signal Yj+2 is selected, the signal from node Nj+1 is detected by sense amplifier SA2, while the signal from node Nj+2 is detected by sense amplifier SA1. In this manner, information in the memory block shown in FIG. 3 can be read out by only two sense amplifiers 58 (SA1, SA2).

As described above, according to a memory device of the present invention, a large number of virtual ground lines which are not set in the ground level in memory information read access are electrically connected to a common bias potential line. As a result, a large equivalent capacitance is formed by such an electrical connection enough to neglect variations in the internal wiring parasitic capacitance and transistor diffusion capacitance which depend on the manufacturing process. Therefore, in switching the potential of the virtual ground line connected to a target read cell, variations in bias level of the common bias potential line can be reduced, and a stable, high-speed memory read access can be realized.

Since the common bias potential line electrically connected to a plurality of virtual ground lines connected to a large number of memory cells except for the target read cell is not charged or discharged, the operation caused by charging/discharging of the parallel total equivalent capacitance of the common bias potential line will not be delayed, and a high-speed operation can be enabled.

Since the total equivalent capacitance of the common bias potential line is charged in advance in power-ON operation (setup), a bias generator in a bias voltage source need not have a high-speed charging capacity, thereby simplifying the bias generator. In addition, since the common bias potential line need not be charged at high speed, the power consumption of the device as a whole can be reduced.

The capacitance of the common bias potential line is large enough to neglect variations in internal wiring parasitic capacitance and transistor diffusion capacitance which depend on the manufacturing process. Therefore, variations in quality of the memory devices can be reduced, and there is provided a memory device having a high yield.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A memory device comprising:
   a plurality of word lines;
   a plurality of bit lines;
   a plurality of virtual ground lines respectively having parasitic capacitances;
   memory cells arranged at intersections between said word lines and said bit lines, each memory cell having a first electrode connected to a corresponding one of said word lines and second and third electrodes respectively connected to corresponding ones of said bit lines and said virtual ground lines;
   a common bias potential line selectively connected to said virtual ground lines;
   bias means for charging said common bias potential line to a predetermined bias level;
   potential setting means capable of setting a potential of said virtual ground line to the bias level charged by said bias means or to a predetermined ground level; and
   a sense amplifier for sensing recorded information of a target read access memory cell through said corresponding bit line when said virtual ground line connected to said target read access memory cell is set at the ground level by said potential setting means,
   wherein said potential setting means includes switch means for connecting remaining virtual ground lines other than said virtual ground line set at the ground level to said common bias potential line.

2. A device according to claim 1, further comprising means for determining satisfaction of a condition Vbias×1/n≦ΔVBL where Vbias is the bias level, ΔVBL is the potential variation of said bit line in storage data access to said memory cell, and n is the number of said virtual ground lines set to the bias level by said potential setting means.

3. A device according to claim 1, wherein said potential setting means comprises a circuit for setting potentials of said virtual ground lines to the bias level and then to the ground level.

4. A device according to claim 2, wherein said potential setting means comprises a circuit for setting potentials of said virtual ground lines to the bias level and then to the ground level.

5. A device according to claim 1, wherein said bias means comprises means for charging said common bias potential line to the bias level only upon a power-ON operation of said memory device, and then inhibiting to repeat a charging/discharging operation of said common bias potential line during storage data read access.

6. A device according to claim 2, wherein said bias means comprises means for charging said common bias potential line to the bias level only upon a power-ON operation of said memory device, and then inhibiting to repeat a charging/discharging operation of said common bias potential line during storage data read access.

7. A device according to claim 3, wherein said bias means comprises means for charging said common bias potential line to the bias level only upon a power-ON operation of said memory device, and then inhibiting to repeat a charging/discharging operation of said common bias potential line during storage data read access.

8. A device according to claim 4, wherein said bias means comprises means for charging said common bias potential line to the bias level only upon a power-ON operation of said memory device, and then inhibiting to repeat a charging/discharging operation of said common bias potential line during storage data read access.

9. A device according to claim 1, further comprising means for connecting, to said common bias potential line, remaining virtual ground lines of a predetermined number of said plurality of virtual ground lines except for said virtual ground line set to the ground level by said potential setting means.

10. A device according to claim 2, further comprising means for connecting, to said common bias potential line, remaining virtual ground lines of a predetermined number of said plurality of virtual ground lines except for said virtual ground line set to the ground level by said potential setting means.

11. A device according to claim 3, further comprising means for connecting, to said common bias potential line, remaining virtual ground lines of a predetermined number of said plurality of virtual ground lines except for said virtual ground line set to the ground level by said potential setting means.

12. A device according to claim 4, further comprising means for connecting, to said common bias potential line, remaining virtual ground lines of a predetermined number of said plurality of virtual ground lines except for said virtual ground line set to the ground level by said potential setting means.

13. A device according to claim 5, further comprising means for connecting, to said common bias potential line, remaining virtual ground lines of a predetermined number of said plurality of virtual ground lines except for said virtual ground line set to the ground level by said potential setting means.

14. A device according to claim 6, further comprising means for connecting, to said common bias potential line, remaining virtual ground lines of a predetermined number of said plurality of virtual ground lines except for said virtual ground line set to the ground level by said potential setting means.

15. A device according to claim 7, further comprising means for connecting, to said common bias potential line, remaining virtual ground lines of a predetermined number of said plurality of virtual ground lines except for said virtual ground line set to the ground level by said potential setting means.

16. A device according to claim 8, further comprising means for connecting, to said common bias potential line, remaining virtual ground lines of a predetermined number of said plurality of virtual ground lines except for said virtual ground line set to the ground level by said potential setting means.

17. A memory device comprising:

a plurality of word lines;

a plurality of bit lines;

a plurality of virtual ground lines respectively having parasitic capacitances;

memory cells arranged at intersections between said word lines and said bit lines, each memory cell having a first electrode connected to a corresponding one of said word lines and second and third electrodes respectively connected to corresponding ones of said bit lines and said virtual ground lines;

a bias potential line selectively connected to said virtual ground lines;

bias means for charging said bias potential line to a predetermined bias level;

potential setting means for setting a potential of said virtual ground line to the bias level charged by said bias means or to a predetermined ground level;

a sense amplifier for sensing recorded information of a target read access memory cell transistor through said corresponding bit line when said virtual ground line connected to said target read access memory cell transistor is set at the ground level by said potential setting means; and switch means for connecting, to said bias potential line, remaining virtual ground lines other than said virtual ground line set at the ground level by said potential setting means.

18. A memory device comprising:

a plurality of row lines;

a plurality of column lines;

a plurality of virtual ground lines respectively having parasitic capacitances;

memory cells arranged at intersections between said row lines and said column lines, each memory cell having a first electrode connected to a corresponding one of said row lines and second and third electrodes respectively connected to corresponding ones of said column lines and said virtual ground lines;

a bias potential line selectively connected to said virtual ground lines;

bias means for charging said bias potential line to a predetermined bias level;

potential setting means for setting a potential of said virtual ground line to the bias level charged by said bias means or to a predetermined ground level;

a sense amplifier for sensing recorded information of a target read access memory cell through said corresponding column line when said virtual ground line connected to said target read access memory cell is set at the ground level by said potential setting means; and switch means for connecting, to said bias potential line, remaining virtual ground lines other than said virtual ground line set at the ground level by said potential setting means.

19. A device according to claim 18, wherein one or more of said memory cells stores information representing any of two or more data pieces.

20. A device according to claim 1, wherein one or more of said virtual ground lines has one end being connected to said potential setting means and another end being left alone.

21. A device according to claim 2, wherein one or more of said virtual ground lines has one end being connected to said potential setting means and another end being left alone.

22. A device according to claim 3, wherein one or more of said virtual ground lines has one end being connected to said potential setting means and another end being left alone.

23. A device according to claim 4, wherein one or more of said virtual ground lines has one end being connected to said potential setting means and another end being left alone.

24. A device according to claim 5, wherein one or more of said virtual ground lines has one end being connected to said potential setting means and another end being left alone.

25. A memory device comprising:

a plurality of word lines;

a plurality of bit lines;

a plurality of virtual ground lines respectively having parasitic capacitances;

memory cells arranged at intersections between said word lines and said bit lines, each memory cell having a first electrode connected to a corresponding one of said word lines and second and third electrodes respectively connected to corresponding ones of said bit lines and said virtual ground lines;

a common bias potential line selectively connected to said virtual ground lines;

bias means for charging said common bias potential line to a predetermined bias level;

potential setting means capable of setting a potential of said virtual ground line to the bias level charged by said bias means or to a predetermined ground level;

a sense amplifier for sensing recorded information of a target read access memory cell through said corresponding bit line when said virtual ground line connected to said target read access memory cell is set at the ground level by said potential setting means; and means for determining satisfaction of a condition $Vbias \times 1/n \leq \Delta VBL$ where Vbias is the bias level, $\Delta VBL$ is the potential variation of said bit line in storage data access to said memory cell, and n is the number of said virtual ground lines set to the bias level by said potential setting means.

wherein said potential setting means includes switch means for connecting remaining virtual ground lines other than said virtual ground line set at the ground level are connected to the common bias potential line by said potential setting means.

26. A device according to claim 25, wherein said bias means comprises means for charging said common bias potential line to the bias level only upon a power-ON operation of said memory device, and then inhibiting to repeat a charging/discharging operation of said common bias potential line during storage data read access.

27. A device according to claim 26, further comprising means for connecting, to said common bias potential line, remaining virtual ground lines of a predetermined number of said plurality of virtual ground lines except for said virtual ground line set to the ground level by said potential setting means.

28. A device according to claim 25, further comprising means for connecting, to said common bias potential line, remaining virtual ground lines of a predetermined number of said plurality of virtual ground lines except for said virtual ground line set to the ground level by said potential setting means.

29. A device according to claim 25, wherein one or more of said virtual ground lines has one end being connected to said potential setting means and another end being left alone.

30. A device according to claim 25, wherein said potential setting means comprises a circuit for setting potentials of said virtual ground lines to the bias level and then to the ground level.

31. A device according to claim 30, wherein said bias means comprises means for charging said common bias potential line to the bias level only upon a power-ON operation of said memory device, and then inhibiting to repeat a charging/discharging operation of said common bias potential line during storage data read access.

32. A device according to claim 31, further comprising means for connecting, to said common bias potential line, remaining virtual ground lines of a predetermined number of said plurality of virtual ground lines except for said virtual ground line set to the ground level by said potential setting means.

33. A device according to claim 30, further comprising means for connecting, to said common bias potential line, remaining virtual ground lines of a predetermined number of said plurality of virtual ground lines except for said virtual ground line set to the ground level by said potential setting means.

34. A device according to claim 30, wherein one or more of said virtual ground lines has one end being connected to said potential setting means and another end being left alone.

35. A device according to claim 25, further comprising means for connecting, to said common bias potential line, remaining virtual ground lines of a predetermined number of said plurality of virtual ground lines except for said virtual ground line set to the ground level by said potential setting means.

36. A device according to claim 25, wherein said bias means comprises means for charging said common bias potential line to the bias level only upon a power-ON operation of said memory device, and then inhibiting to repeat a charging/discharging operation of said common bias potential line during storage data read access.

37. A device according to claim 36, further comprising means for connecting, to said common bias potential line, remaining virtual ground lines of a predetermined number of said plurality of virtual ground liens except for said virtual ground line set to the ground level by said potential setting means.

38. A device according to claim 36, wherein one or more of said virtual ground lines has one end being connected to said potential setting means and another end being left alone.

39. A device according to claim 25, wherein said potential setting means comprises a circuit for setting potentials of said virtual ground lines to the bias level and then to the ground level.

40. A device according to claim 39, wherein said bias means comprises means for charging said common bias potential line to the bias level only upon a power-ON operation of said memory device, and then inhibiting to repeat a charging/discharging operation of said common bias potential line during storage data read access.

41. A device according to claim 40, further comprising means for connecting, to said common bias potential line, remaining virtual ground lines of a predetermined number of said plurality of virtual ground lines except for said virtual ground line set to the ground level by said potential setting means.

42. A device according to claim 39, further comprising means for connecting, to said common bias potential line, remaining virtual ground lines of a predetermined number of said plurality of virtual ground lines except for said virtual ground line set to the ground level by said potential setting means.

43. A device according to claim 39, wherein one or more of said virtual ground lines has one end being connected to said potential setting means and another end being left alone.

44. A memory device comprising:

a plurality of word lines;

a plurality of bit lines;

a plurality of virtual ground lines respectively having parasitic capacitances;

memory cells arranged at intersections between said word lines and said bit lines, each memory cell having a first electrode connected to a corresponding one of said word lines and second and third electrodes respectively connected to corresponding ones of said bit lines and said virtual ground lines;

a common bias potential line selectively connected to said virtual ground lines;

bias means for charging said common bias potential line to a predetermined bias level;

potential setting means capable of setting a potential of said virtual ground line to the bias level charged by said bias means or to a predetermined ground level; and a sense amplifier for sensing recorded information of a target read access memory cell through said corresponding bit line when said virtual ground line connected to said target read access memory cell is set at the ground level by said potential setting means, wherein one or more of said virtual ground lines has one end being connected to said potential setting means and another end being left alone, and wherein remaining virtual ground lines other than said virtual ground line set at the ground level are connected to the common bias potential line by said potential setting means.

45. A device according to claim 44, further comprising means for determining satisfaction of a condition $Vbias \times 1/n \leq \Delta VBL$ where $Vbias$ is the bias level, $\Delta VBL$ is the potential variation of said bit line in storage data access to said memory cell, and n is the number of said virtual ground lines set to the bias level by said potential setting means.

46. A device according to claim 45, wherein said bias means comprises means for charging said common bias potential line to the bias level only upon a power-ON operation of said memory device, and then inhibiting to repeat a charging/discharging operation of said common bias potential line during storage data read access.

47. A device according to claim 46, further comprising means for connecting, to said common bias potential line, remaining virtual ground lines of a predetermined number of said plurality of virtual ground lines except for said virtual ground line set to the ground level by said potential setting means.

48. A device according to claim 45, wherein one or more of said virtual ground lines has one end being connected to said potential setting means and another end being left alone.

49. A device according to claim 45, wherein said potential setting means comprises a circuit for setting potentials of said virtual ground lines to the bias level and then to the ground level.

50. A device according to claim 49, wherein said bias means comprises means for charging said common bias potential line to the bias level only upon a power-ON operation of said memory device, and then inhibiting to repeat a charging/discharging operation of said common bias potential line during storage data read access.

51. A device according to claim 50, further comprising means for connecting, to said common bias potential line, remaining virtual ground lines of a predetermined number of said plurality of virtual ground lines except for said virtual ground line set to the ground level by said potential setting means.

52. A device according to claim 45, further comprising means for connecting, to said common bias potential line, remaining virtual ground lines of a predetermined number of said plurality of virtual ground lines except for said virtual ground line set to the ground level by said potential setting means.

53. A device according to claim 45, wherein one or more of said virtual ground lines has one end being connected to said potential setting means and another end being left alone.

54. A device according to claim 44, further comprising means for connecting, to said common bias potential line, remaining virtual ground lines of a predetermined number of said plurality of virtual ground lines except for said virtual ground line set to the ground level by said potential setting means.

55. A device according to claim 44, wherein said potential setting means comprises a circuit for setting potentials of said virtual ground lines to the bias level and then to the ground level.

56. A device according to claim 55, wherein said bias means comprises means for charging said common bias potential line to the bias level only upon a power-ON operation of said memory device, and then inhibiting to repeat a charging/discharging operation of said common bias potential line during storage data read access.

57. A device according to claim 56, further comprising means for connecting, to said common bias potential line, remaining virtual ground lines of a predetermined number of said plurality of virtual ground lines except for said virtual ground line set to the ground level by said potential setting means.

58. A device according to claim 55, further comprising means for connecting, to said common bias potential line, remaining virtual ground lines of a predetermined number of said plurality of virtual ground lines except for said virtual ground line set to the ground level by said potential setting means.

59. A device according to claim 55, wherein one or more of said virtual ground lines has one end being connected to said potential setting means and another end being left alone.

60. A device according to claim 44, further comprising means for connecting, to said common bias potential line, remaining virtual ground lines of a predetermined number of said plurality of virtual ground lines except for said virtual ground line set to the ground level by said potential setting means.

61. A device according to claim 44, wherein said bias means comprises means for charging said common bias potential line to the bias level only upon a power-ON operation of said memory device, and then inhibiting to repeat a charging/discharging operation of said common bias potential line during storage data read access.

62. A device according to claim 61, further comprising means for connecting, to said common bias potential line, remaining virtual ground lines of a predetermined number of said plurality of virtual ground liens except for said virtual ground line set to the ground level by said potential setting means.

63. A device according to claim 61, wherein one or more of said virtual ground lines has one end being connected to said potential setting means and another end being left alone.

64. A memory device comprising:
   a plurality of word lines;
   a plurality of bit lines;
   a plurality of virtual ground lines respectively having parasitic capacitances; memory cells arranged at intersections between said word lines and said bit lines, each memory cell having a first electrode connected to a corresponding one of said word lines and second and third electrodes respectively connected to corresponding ones of said bit lines and said virtual ground lines;
   a common bias potential line selectively connected to said virtual ground lines;
   bias means for charging said common bias potential line to a predetermined bias level;
   potential setting means capable of setting a potential of said virtual ground line to the bias level charged by said bias means or to a predetermined ground level, said potential setting means comprising a circuit for setting potentials of said virtual ground lines to the bias level and then to the ground level; and
   a sense amplifier for sensing recorded information of a target read access memory cell through said corresponding bit line when said virtual ground line connected to said target read access memory cell is set at the ground level by said potential setting means,
   wherein one or more of said virtual ground lines has one end being connected to said potential setting means and another end being left alone, and wherein remaining virtual ground lines other than said virtual ground line set at the ground level are connected to the common bias potential line by said potential setting means.

65. A device according to claim 64, further comprising means for determining satisfaction of a condition $Vbias \times 1/n \leq \Delta VBL$ where Vbias is the bias level, $\Delta VBL$ is the potential variation of said bit line in storage data access to said memory cell, and n is the number of said virtual ground lines set to the bias level by said potential setting means.

66. A device according to claim 64, wherein said bias means comprises means for charging said common bias potential line to the bias level only upon a power-ON operation of said memory device, and then inhibiting to repeat a charging/discharging operation of said common bias potential line during storage data read access.

67. A device according to claim 64, further comprising means for connecting, to said common bias potential line, remaining virtual ground lines of a predetermined number of said plurality of virtual ground lines except for said virtual ground line set to the ground level by said potential setting means.

68. A device according to claim 64, further comprising means for connecting, to said common bias potential line, remaining virtual ground lines of a predetermined number of said plurality of virtual ground lines except for said virtual ground line set to the ground level by said potential setting means.

69. A device according to claim 64, wherein said bias means comprises means for charging said common bias potential line to the bias level only upon a power-ON operation of said memory device, and then inhibiting to repeat a charging/discharging operation of said common bias potential line during storage data read access.

70. A memory device comprising:
a plurality of row lines;
a plurality of column lines;
a plurality of virtual ground lines respectively having parasitic capacitances;
memory cells arranged at intersections between said row lines and said column lines, each memory cell having a first electrode connected to a corresponding one of said row lines and second and third electrodes respectively connected to corresponding ones of said column lines and said virtual ground lines;
a bias potential line selectively connected to said virtual ground lines;
bias means for charging said bias potential line to a predetermined bias level;
potential setting means for setting a potential of said virtual ground line to the bias level charged by said bias means of to a predetermined ground level;
a sense amplifier for sensing recorded information of a target read access memory cell through said corresponding column line when said virtual ground line connected to said target read access memory cell is set at the ground level by said potential setting means;
means for connecting, to said bias potential line, remaining virtual ground lines other than said virtual ground line set at the ground level by said potential setting means; and
means for determining satisfaction of a condition Vbias× $1/n \leq \Delta VBL$ where Vbias is the bias level, $\Delta VBL$ is the potential variation of said bit line in storage data access to said memory cell, and n is the number of said virtual ground lines set to the bias level by said potential setting means.

71. A device according to claim 70, wherein said bias means comprises means for charging said common bias potential line to the bias level only upon a power-ON operation of said memory device, and then inhibiting to repeat a charging/discharging operation of said common bias potential line during storage data read access.

72. A device according to claim 70, further comprising means for connecting, to said common bias potential line, remaining virtual ground lines of a predetermined number of said plurality of virtual ground lines except for said virtual ground line set to the ground level by said potential setting means.

73. A device according to claim 70, wherein one or more of said virtual ground lines has one end being connected to said potential setting means and another end being left alone.

74. A device according to claim 70, wherein said potential setting means comprises a circuit for setting potentials of said virtual ground lines to the bias level and then to the ground level.

75. A device according to claim 70, further comprising means for connecting, to said common bias potential line, remaining virtual ground lines of a predetermined number of said plurality of virtual ground lines except for said virtual ground line set to the ground level by said potential setting means.

76. A device according to claim 70, wherein said bias means comprises means for charging said common bias potential line to the bias level only upon a power-ON operation of said memory device, and then inhibiting to repeat a charging/discharging operation of said common bias potential line during storage data read access.

77. A device according to claim 70, wherein said potential setting means comprises a circuit for setting potentials of said virtual ground lines to the bias level and then to the ground level.

78. A memory device comprising:
a plurality of row lines;
a plurality of column lines;
a plurality of virtual ground lines respectively having parasitic capacitances;
memory cells arranged at intersections between said row lines and said column lines, each memory cell having a first electrode connected to a corresponding one of said row lines and second and third electrodes respectively connected to corresponding ones of said column lines and said virtual ground lines;
a bias potential line selectively connected to said virtual ground lines;
bias means for charging said bias potential line to a predetermined bias level;
potential setting means for setting a potential of said virtual ground line to the bias level charged by said bias means or a predetermined ground level;
a sense amplifier for sensing recorded information of a target read access memory cell through said corresponding column line when said virtual ground line connected to said target read access memory cell is set at the ground level by said potential setting means; and
means for connecting, to said bias potential line, remaining virtual ground lines other than said virtual ground line set at the ground level by said potential setting means;
wherein one or more of said virtual ground lines has one end being connected to said potential setting means and another end being left alone.

79. A device according to claim 78, further comprising means for determining satisfaction of a condition Vbias×1/ $n \leq \Delta VBL$ where Vbias is the bias level, $\Delta VBL$ is the potential variation of said bit line in storage data access to said memory cell, and n is the number of said virtual ground lines set to the bias level by said potential setting means.

80. A device according to claim 78, wherein said bias means comprises means for charging said common bias potential line to the bias level only upon a power-ON operation of said memory device, and then inhibiting to repeat a charging/discharging operation of said common bias potential line during storage data read access.

81. A device according to claim 78, further comprising means for connecting, to said common bias potential line, remaining virtual ground lines of a predetermined number of said plurality of virtual ground lines except for said virtual ground line set to the ground level by said potential setting means.

82. A device according to claim 78, wherein said bias means comprises means for charging said common bias potential line to the bias level only upon a power-ON operation of said memory device, and then inhibiting to repeat a charging/discharging operation of said common bias potential line during storage data read access.

83. A device according to claim 78, further comprising means for connecting, to said common bias potential line, remaining virtual ground lines of a predetermined number of said plurality of virtual ground lines except for said virtual ground line set to the ground level by said potential setting means.

* * * * *